United States Patent
Jiang et al.

[11] Patent Number: 6,061,485
[45] Date of Patent: May 9, 2000

[54] METHOD FOR WAVELENGTH DIVISION MULTIPLEXING UTILIZING DONUT MODE VERTICAL CAVITY SURFACE EMITTING LASERS

[75] Inventors: Wenbin Jiang, Phoenix; Michael S. Lebby, Apache Junction; Davis H. Hartman, Chandler, all of Ariz.

[73] Assignee: Motorola, Inc., Schaumburg, Ill.

[21] Appl. No.: 08/963,173

[22] Filed: Nov. 3, 1997

[51] Int. Cl.$^7$ ........................................ G02B 6/26
[52] U.S. Cl. ............... 385/28; 385/24; 385/49; 359/124; 372/96; 372/99
[58] Field of Search ................ 385/49, 24, 28; 372/96, 99, 45, 46; 359/124

[56] References Cited

U.S. PATENT DOCUMENTS 4,834,481  5/1989  Lawson et al. ............... 350/96.15
5,394,489  2/1995  Koch ............................. 385/14
5,963,576  10/1999  Claisse et al. .................. 372/96

Primary Examiner—Hemang Sanghavi
Assistant Examiner—Benjamin Cushwa
Attorney, Agent, or Firm—Eugene A. Parsons

[57] ABSTRACT

A method for wavelength division multiplexing including the steps of providing at least two annular waveguide or spatially donut mode and spectrally single mode vertical cavity surface emitting lasers for operating in a single high order transverse mode. In addition, provided is a multimode fiber based data link. The spatially donut mode and spectrally single mode vertical cavity surface emitting lasers are coupled to the multimode fibers through wavelength multiplexing techniques. During operation, a modulation voltage or modulation current is applied to the spatially donut mode and spectrally single mode vertical cavity surface emitting lasers thereby exciting higher order modes in the multimode fiber based data link and thus achieving either wavelength division multiplexing or de-multiplexing over a large transmission distance.

20 Claims, 2 Drawing Sheets

METHOD FOR WAVELENGTH DIVISION MULTIPLEXING UTILIZING DONUT MODE VERTICAL CAVITY SURFACE EMITTING LASERS

FIELD OF THE INVENTION

This invention relates to vertical cavity surface emitting lasers and more specifically to a method of utilizing vertical cavity surface emitting lasers for wavelength division multiplexing.

BACKGROUND OF THE INVENTION

In the past few years there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE).

VCSELs are formed by depositing a plurality of layers on a substrate to form the VCSEL. See, for example, U.S. Pat. No. 5,034,092, entitled "PLASMA ETCHING OF SEMI-CONDUCTOR SUBSTRATES", issued Jul. 23, 1991, assigned to the same assignee and included herein by this reference, and U.S. Pat. No. 5,256,596, entitled "TOP EMITTING VCSEL WITH IMPLANT", issued Oct. 26, 1993, assigned to the same assignee and included herein by this reference.

VCSELs generally include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELS is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlGaAs/AlAs material system wherein the different refractive index of each layer of a pair is achieved by altering the aluminum content in the layers. In conventional devices, the number of mirror pairs per stack may range from 20 to 40 to achieve a high percentages of reflectivity, depending on the difference between the refractive indices of the layers. The large number of pairs increases the percentage of reflected light.

Traditionally, the transmission distance of a multimode fiber based data link has been limited to 300–500 meters because of the limitation of dispersion effects. Off-set launch methods have been used to allow less modes in the fiber to be excited, therefore reducing the dispersion effect. Offset launch methods are utilized because the light source operates in a single spatial mode. With a decrease in the dispersion effect, data can be transmitted across a longer distance. However, how much off-set is needed, and how to control the off-set uniformity from link to link in manufacturing is a problem.

It would be highly advantageous, therefore, to remedy the foregoing and other deficiencies inherent in the prior art.

Accordingly, it is an object of the present invention to provide a new and improved method for achieving greater distance data transmission based on multimode fibers utilizing a donut mode VCSEL.

Donut mode VCSELs operate to excite only higher order modes in the fibers without off-set launching. Through the excitation of less modes in the fibers, greater transmission distances can be achieved. In addition, donut mode VCSELs operate spectrally in a single mode. This characteristic can be utilized to achieve high speed data communication based on wavelength division multiplexing technology by combining a group of VCSELs or an array of VCSELs with each VCSEL operating at its own preset wavelength. It is therefore an object of the present invention to propose a method to achieve wavelength division multiplexing by using spectrally single mode but spatially donut mode VCSELs.

Another object of the invention is to provide a reliable method for achieving wavelength division multiplexing that allows for a large transmission distance.

Yet another object of the invention is to provide for a method for achieving wavelength division multiplexing in which cross-talk between neighboring channels is maintained at a minimum.

Another object of the present invention is to provide for a method of achieving wavelength division multiplexing in which a spatially donut mode and spectrally single mode VCSEL allows for greater system margin in wavelength division multiplexing and de-multiplexing.

SUMMARY OF THE INVENTION

Briefly, to achieve the desired objects of the instant invention in accordance with a preferred embodiment thereof, provided is a method for wavelength division multiplexing including the steps of providing at least two annular waveguide or spatially donut mode and spectrally single mode VCSELs characterized as operating in a single high order transverse mode. In addition, provided is a multimode fiber based data link. To achieve operation, the at least two spatially donut mode and spectrally single mode VCSELs are coupled to the fibers of the multimode fiber based data link. Next, a modulation voltage or modulation current is applied to the at least two spatially donut mode and spectrally single mode VCSELs thereby exciting higher order modes in the multimode fiber based data link and thus achieving wavelength division multiplexing or de-multiplexing over a large transmission distance.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
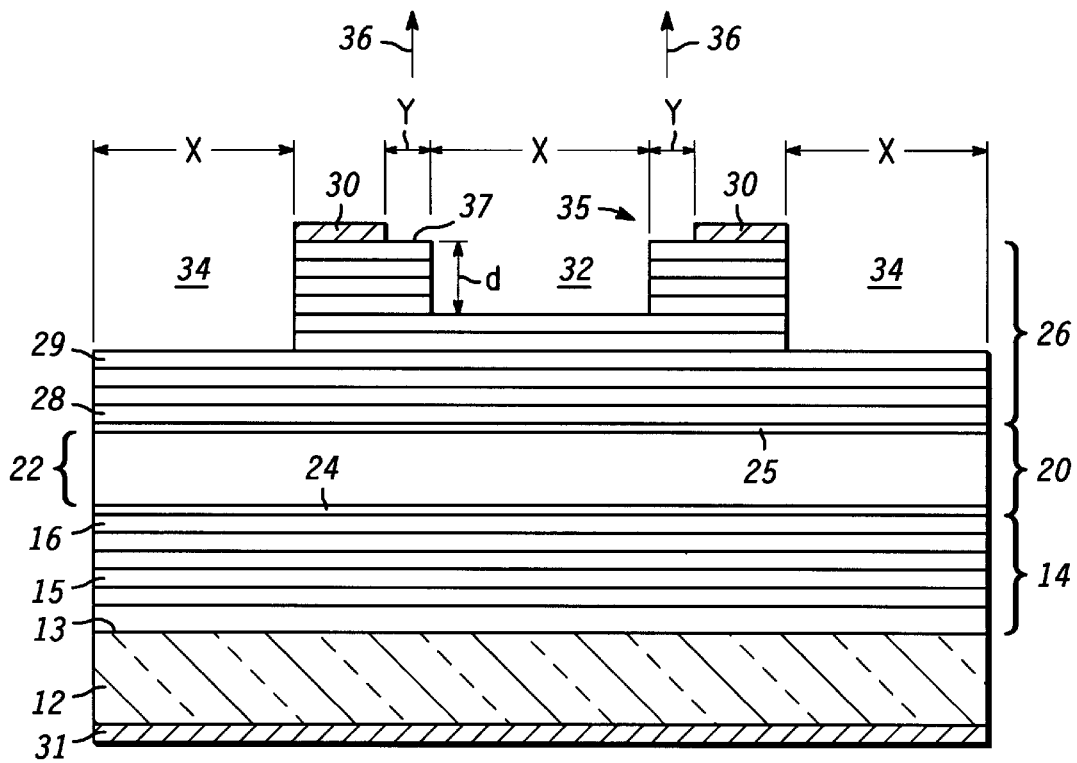
FIG. 1 is a sectional view of a spatially donut mode and spectrally single mode VCSEL utilized in the method of the present invention.

Turning now to the drawings in which like reference characters indicate corresponding elements throughout the several views, attention is first directed to FIG. 1 which illustrates in simplified sectional view an annular waveguide, or spatially donut mode and spectrally single mode, VCSEL 10 utilized in the method for wavelength division multiplexing of the present invention. Spatially donut mode and spectrally single mode VCSEL 10 includes a substrate 12, which in this specific embodiment, is GaAs. GaAs is preferably used to facilitate epitaxial growth of the components of VCSEL 10 which operates in a stable single high order transverse mode, having a wavelength of approximately in the range of 760–870 nm. It should be understood that GaAs is only utilized as an example and other semiconductor materials may be employed as substrate 12.

Substrate 12 has an upper surface 13 on which a first mirror stack 14 is disposed. First mirror stack 14 includes a plurality of mirror pairs 15 and 16 in a n-doped $Al_xGa_{1-x}As/Al_yGa_{1-y}As$ material system. An active region 20 is disposed on first mirror stack 14. Active region 20 includes an active structure 22 in an GaAs or AlGaAs material system, sandwiched between a n-doped first cladding region 24, adjacent first mirror stack 14, and a p-doped second cladding region 25. A second mirror stack 26 is disposed on second cladding region 25 and includes mirror pairs 28 and 29 in a p-doped $Al_xGa_{1-x}As/Al_yGa_{1-y}As$ material system. Finally, a contact layer 30 is deposited on second mirror stack 26.

First mirror stack 14 is grown by epitaxially depositing pairs of layers 15 and 16 on substrate 12. In order to crystal lattice match mirror stack 14 to substrate 12 a suitable semiconductor material system must be deposited. In this specific example, substrate 12 is GaAs and, therefore, a $Al_xGa_{1-x}As/Al_yGa_{1-y}As$ material system is employed. Approximately 20 to 40 mirror pairs of this material system are deposited on substrate 12 depending on the difference between the refractive indices of the layers. The different refractive index of the layers of each pair is achieved by altering the aluminum content. In this specific embodiment, a $Al_{0.85}Ga_{0.15}As$ layer 45 and a $Al_{0.15}Ga_{0.25}As$ 46 layer forming a mirror pair is preferred for wavelength from 830–870 nm. The large number of pairs increases the percentage of reflected light.

Cladding region 24 includes one or more layers which may be graded. In this specific embodiment, cladding region 24 is formed of a AlGaAs material system. For example cladding region 24 includes a first layer (not shown) formed of an n-doped AlGaAs with the Al mole fraction ranging from 40% to 50% and a second layer (not shown) formed of an undoped AlGaAs material having an Al mole fraction ranging from 30% to 40% for better carrier confinement of active structure 22.

Active structure 22, in this embodiment, includes three quantum well layers (not shown), separated by barrier layers (not shown). For example, the quantum well layers and the barrier layers are each approximately 100 Å and the total thickness of active region 20 is approximately one wavelength of the emitted light or a multiple thereof. One skilled in the art will understand that more or fewer quantum well layers and barrier layers can be used depending upon the application. Active region 20 and first and second mirror stacks 14 and 26, respectively, are configured to emit light with a wavelength in a range of approximately 760–870 nm. To achieve this range the quantum wells are configured with a direct energy bandgap in a range of approximately 1.43–1.63 eV with x varying from 0 to 0.12.

Cladding region 25 includes one or more layers which may be graded if necessary. In this specific embodiment, cladding region 25 is formed of a AlGaAs material system. For example cladding region 25 includes a first layer (not shown) formed of undoped AlGaAs with an Al mole fraction ranging from 30% to 40%, and a second layer (not shown) formed of a p-doped AlGaAs material having an Al mole fraction ranging from 40% to 60% for better carrier confinement.

Mirror stack 26 is grown by epitaxially depositing pairs of layers on cladding region 25. In order to crystal lattice match mirror stack 26 to active structure 22, a suitable semiconductor material system must be deposited. In this specific example, cladding region 25 is GaAs based and, therefore, a $Al_xGa_{1-x}As/Al_yGa_{1-y}As$ material system is employed. Approximately 20 to 40 mirror pairs of this material system are deposited on cladding region 25 depending on the difference between the refractive indices of the layers. The different refractive index the layers of each pair is achieved by altering the aluminum content. In this specific embodiment, a $Al_{0.85}Ga_{0.15}As$ layer 28 and a $Al_{0.15}Ga_{0.85}As$ 29 layer forming a mirror pair is preferred for a wavelength from 830–870 nm. The large number of pairs increases the percentage of reflected light.

To complete VCSEL 10, contact layer 30 is positioned on mirror stack 26, and a contact layer 31 is positioned on substrate 12, for example on the rear surface thereof. As will be understood by those skilled in the art, contact 30 is so constructed as to permit the emission of light from VCSEL 10.

Spatially donut mode and spectrally single mode VCSEL 10 is fabricated by epitaxial growth of the plurality of layers of different compositions previously identified. Epitaxial deposition of the plurality of layers is accomplished by well known techniques in the art such as MBE, MOCVD, or the like. These techniques enable epitaxial deposition of relatively thin and thick layers of a variety of materials such as gallium arsenide, aluminum gallium arsenide, aluminum arsenide, silicon or the like. Fabrication of VCSEL devices typically use epitaxial deposition extensively to produce the multitude of layers of different materials which make up the device.

Once the deposition of the plurality of layers of different compositions is complete, spatially donut mode and spectrally single mode VCSEL 10 undergoes a final step to form the complete device. More particularly, a portion of second mirror stack 26 is selectively removed, more particularly is selectively etched, to form a non-lasing area, or etched region 32. During the etching process, second mirror stack 26 is etched down from an uppermost surface 37, noted by "d" in FIG. 1, approximately 1.0–2.0 microns using one of a dry etch process or a wet etch process. It should be understood that the depth of etching can be increased or decreased dependent upon the specific application for the laser device. This circular portion of the second mirror stack 26 that is removed has the effect of preventing the device from lasing in this etched region 32 due to insufficient reflectivity to support lasing. It should be understood that in this particular embodiment, a region 34 is additionally etched to prevent the device from lasing in this region. It should be noted that all non-lasing regions are noted by a "x" and the lasing region is noted by a "y". This defining of lasing region 35 and non-lasing regions 32 and 34 in effect forces VCSEL 10 to operate in a single high order transverse mode partially due to annular waveguiding. Accordingly, light 36 generated by VCSEL 10 is emitted in an annular emission region. The mode order that annular waveguide VCSEL 10 can support is adjustable by varying the diameter, "x", of etched region 32 relative to the mesa diameter of VCSEL 10, and height "d". Further information regarding donut mode or annular waveguide VCSELs can be found in U.S. pending patent application, Ser. No. 08/905,339, now U.S. Pat. No. 5,963,576, entitled "ANNULAR WAVEGUIDE VERTICAL CAVITY SURFACE EMITTING LASER AND METHOD OF FABRICATION", filed Aug. 4, 1997, assigned to the same assignee and incorporated herein by this reference.

Figure 2:
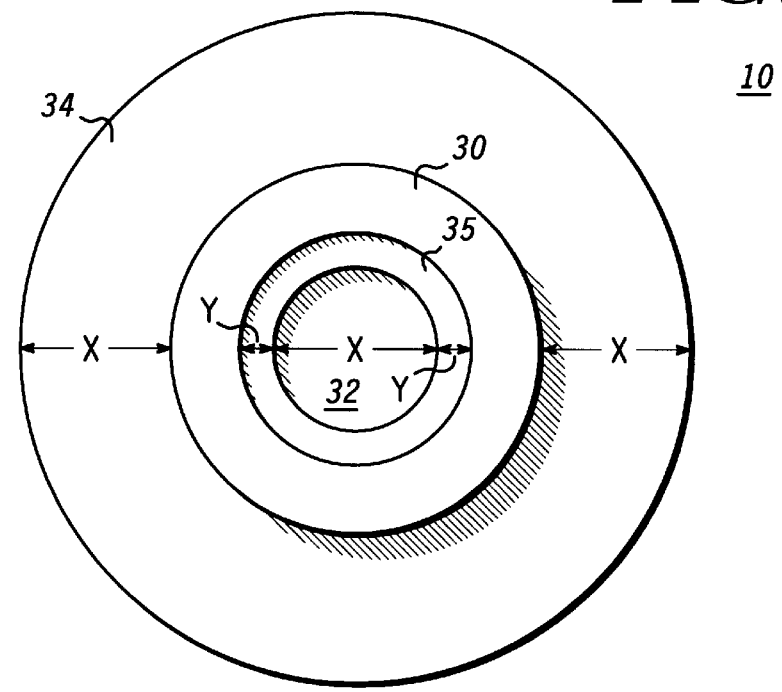
FIG. 2 is a top view of the field of emission of the spatially donut mod;e d spectrally single mode VCSEL of FIG. 1.

Referring now to FIG. 2, illustrated is a top view of spatially donut mode and spectrally single mode VCSEL 10 of FIG. 1. further illustrating contact layer 30, annular emission region 35, and etched regions 32 and 34. It should be understood that throughout the drawings that while a single VCSEL structure is illustrated, there can be many of these structures located on substrate 12 to form arrays.

Figure 3:
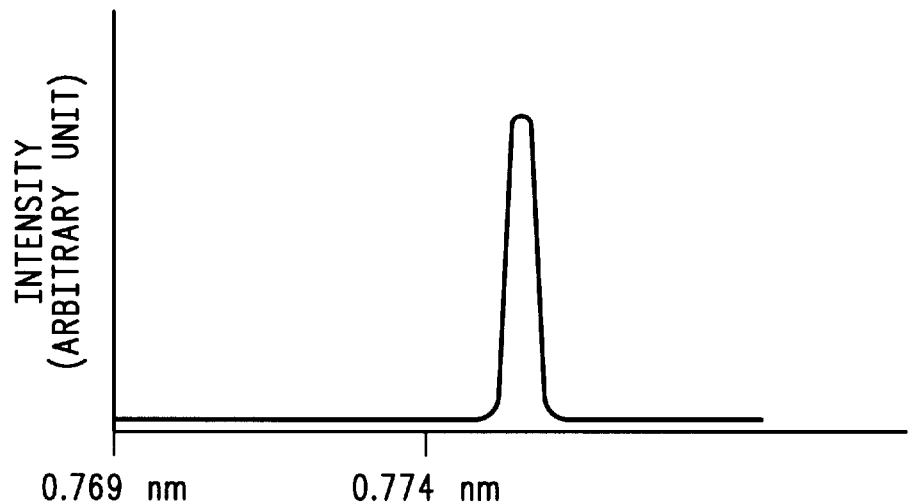
FIG. 3 is a graphical representation of the wavelength spectrum of the spatially donut mode and spectrally single mode VCSEL of FIG. 1 utilized in accordance with the present invention.

A graphical representation 40 of the intensity of light 64 generated by spatially donut mode and spectrally single mode VCSEL 10 versus the corresponding wavelength is illustrated in FIG. 3. More particularly, illustrated is the wavelength spectrum of light generated by spatially donut mode and spectrally single mode VCSEL 10. Typically, a multimode high order VCSEL will generate multiple wavelengths. VCSEL 10 of the present invention operates as an annular waveguide thereby operating to achieve a stable single high order transverse mode having a single wavelength. This type of VCSEL device is therefore capable of operating in a stable high order single transverse mode and can be utilized in wavelength division multiplexing and de-multiplexing applications. VCSEL 10 operates having a finite spectral width. In addition, in that spatially donut mode and spectrally single mode VCSEL 10 can be controlled to emit light at one particular wavelength, it is effectively single mode in the frequency domain. This unique feature allows spatially donut mode and spectrally single mode VCSEL 10 to be used in wavelength division multiplexing and de-multiplexing applications by using a plurality of spatially donut mode and spectrally single mode VCSELs operating at different wavelengths.

Figure 4:
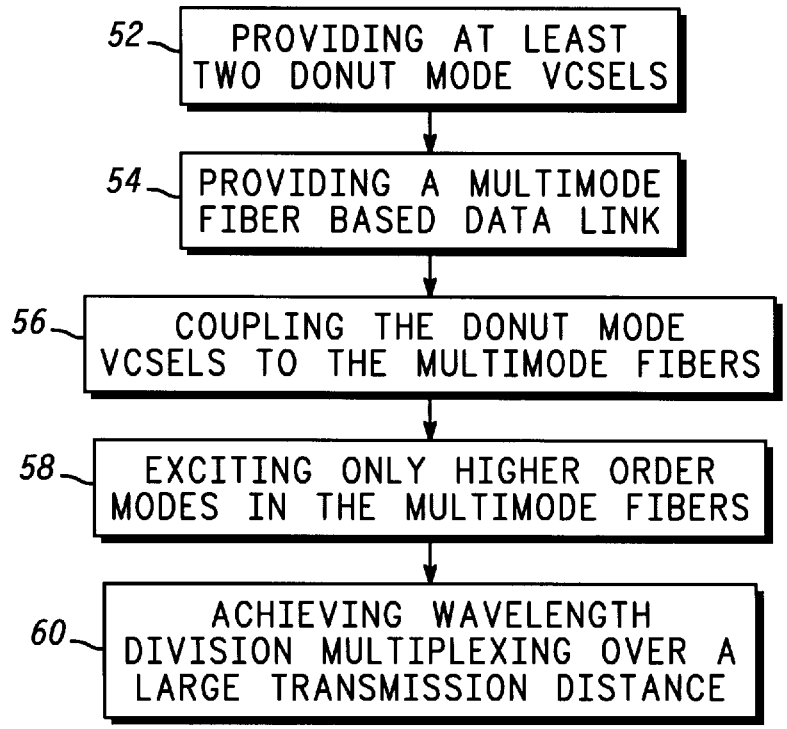
FIG. 4 is a flow chart showing the steps in the method of wavelength division multiplexing utilizing the spatially donut mode and spectrally sin ode VCSEL of FIG. 1.

Referring now to FIG. 4 illustrated is a flow chart showing a method 50 for wavelength division multiplexing utilizing the spatially donut mode and spectrally single mode VCSEL 10 as previously described. Initially provided 52 are at least two spatially donut mode and spectrally single mode VCSELs, generally similar to spatially donut mode and spectrally single mode VCSEL 10 as previously disclosed. The at least two VCSELs operate at different wavelengths with each having a prespecified narrow spectral width. In addition, provided 54 is a multimode fiber based data link with input wavelength multiplexing function and output de-multiplexing function. Next, the spatially donut mode and spectrally single mode VCSELs are coupled 56 to the multimode fibers of the multimode data link, thereby providing for the excitation 58 of only higher order modes in the multimode fibers. This can be achieved because the donut mode beam has a large launching angle for every portion of the beam. In a preferred method, the spatially donut mode and spectrally single mode VCSELs operate at different wavelengths, uniformly spaced apart. The VCSELs are aligned to the fiber for light launching without any spatial off-set. This ability to excite only higher order modes in the fiber based data link, means less dispersion effect, therefore the achievement 60 of wavelength division multiplexing or de-multiplexing over a longer transmission distance than has previously been achieved. In a preferred method, the transmission distance of the emitted light is approximately 1 kilometer.

As an example, to achieve wavelength division multiplexing, a four channel system can use four individual spatially donut mode and spectrally single mode VCSELs, generally similar to VCSEL 10, each having a specific wavelength uniformly distributed apart. Alternatively, a 1×4 VCSEL array can be used with four different wavelengths emitted from each laser. The unique spectral features of the spatially donut mode and spectrally single mode VCSELs allows for easier and closer packed multiplexing and de-multiplexing without any significant cross-talk between the neighboring channels.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

What is claimed is:

1. A method for wavelength division multiplexing comprising the steps of:

providing at least two spatially donut mode and spectrally single mode vertical cavity surface emitting lasers;

providing a multimode fiber based data link;

coupling the at least two spatially donut mode and spectrally single mode vertical cavity surface emitting lasers to the multimode fiber based data link; and exciting only higher order modes in the multimode fiber based data link, thus achieving multimode fiber based wavelength division multiplexing over a large transmission distance.

2. A method for wavelength division multiplexing as claimed in claim 1 wherein the at least two spatially donut mode and spectrally single mode vertical cavity surface emitting lasers operate at different wavelengths with each having a finite spectral width.

3. A method for wavelength division multiplexing as claimed in claim 1 wherein the at least two spatially donut mode and spectrally single mode vertical cavity surface emitting lasers operate at different wavelengths uniformly spaced apart.

4. A method for wavelength division multiplexing as claimed in claim 1 wherein the at least two spatially donut mode and spectrally single mode vertical cavity surface emitting lasers include a substrate element having a surface, a first mirror stack formed on the surface of the substrate element, an active region with a quantum well, the active region being disposed on the first mirror stack and a second mirror stack disposed on the active region, the second mirror stack including an etched region defining an annular emission region.

5. A method for wavelength division multiplexing as claimed in claim 1 wherein the at least two spatially donut mode and spectrally single mode vertical cavity surface emitting lasers operate in a stable single high order transverse mode.

6. A method for wavelength division multiplexing as claimed in claim 1 wherein the step of achieving wavelength division multiplexing over a large transmission distance is characterized by a transmission distance of approximately 1 kilometer.

7. A method for wavelength division multiplexing comprising the steps of:

providing at least two spatially donut mode and spectrally single mode vertical cavity surface emitting lasers, each of the at least two spatially donut mode and spectrally single mode vertical cavity surface emitting lasers characterized as operating in a stable single high order mode;

providing a multimode fiber based data link; and coupling the at least two spatially donut mode and spectrally single mode vertical cavity surface emitting lasers to the multimode fiber based data link to excite only higher order modes in the multimode fiber based data link, thus achieving one of multimode fiber based wavelength division multiplexing and multimode fiber based wavelength division de-multiplexing over a large transmission distance.

8. A method for wavelength division multiplexing as claimed in claim 7 wherein the at least two spatially donut mode and spectrally single mode vertical cavity surface emitting lasers operate at different wavelengths with each having a finite spectral width.

9. A method for wavelength division multiplexing as claimed in claim 7 wherein the at least two spatially donut mode and spectrally single mode vertical cavity surface emitting lasers operate at different wavelengths uniformly spaced apart.

10. A method for wavelength division multiplexing as claimed in claim 7 wherein the at least two spatially donut mode and spectrally single mode vertical cavity surface emitting lasers include a substrate element having a surface, a first mirror stack formed on the surface of the substrate element, an active region with a quantum well, the active region being disposed on the first mirror stack and a second mirror stack disposed on the active region, the second mirror stack including an etched region defining an annular emission region.

11. A method for wavelength division multiplexing as claimed in claim 7 wherein the step of achieving wavelength division multiplexing over a large transmission distance is characterized by a transmission distance of approximately 1 kilometer.

12. A method for wavelength division multiplexing as claimed in claim 7 wherein the at least two spatially donut mode and spectrally single mode vertical cavity surface emitting lasers include an array of spatially donut mode and spectrally single mode vertical cavity surface emitting lasers, each emitting light in a specific wavelength.

13. A method for wavelength division multiplexing as claimed in claim 12 wherein the array of spatially donut mode and spectrally single mode vertical cavity surface emitting lasers includes multiplexing a plurality of channels, to achieve a faster transmission speed.

14. A method for wavelength division multiplexing comprising the steps of:

providing at least two spatially donut mode and spectrally single mode vertical cavity surface emitting lasers, each of the at least two spatially donut mode and spectrally single mode vertical cavity surface emitting lasers including a substrate element having a surface, a first mirror stack formed on the surface of the substrate element, an active region with a quantum well, the active region being disposed on the first mirror stack and a second mirror stack disposed on the active region, the second mirror stack including an etched region defining an annular emission region;

providing a multimode fiber based data link;

coupling the at least two spatially donut mode and spectrally single mode vertical cavity surface emitting lasers to the multimode fibers; and exciting only higher order modes in the multimode fiber based data link, thus achieving multimode fiber based wavelength division multiplexing over a large transmission distance.

15. A method for wavelength division multiplexing as claimed in claim 14 wherein the at least two spatially donut mode and spectrally single mode vertical cavity surface emitting lasers operate at different wavelengths with each having a finite spectral width.

16. A method for wavelength division multiplexing as claimed in claim 14 wherein the at least two spatially donut mode and spectrally single mode vertical cavity surface emitting lasers operate at different wavelengths uniformly spaced apart.

17. A method for wavelength division multiplexing as claimed in claim 14 wherein the at least two spatially donut mode and spectrally single mode vertical cavity surface emitting lasers operate in a stable single high order transverse mode.

18. A method for wavelength division multiplexing as claimed in claim 14 wherein the step of achieving wavelength division multiplexing over a large transmission distance is characterized by a transmission distance of approximately 1 kilometer.

19. A method for wavelength division multiplexing as claimed in claim 14 wherein the at least two spatially donut mode and spectrally single mode vertical cavity surface emitting lasers include an array of spatially donut mode and spectrally single mode vertical cavity surface emitting lasers, each emitting light in a specific wavelength.

20. A method for wavelength division multiplexing as claimed in claim 19 wherein the array of spatially donut mode and spectrally single mode vertical cavity surface emitting lasers includes multiplexing a plurality of channels, to achieve a faster transmission speed.

* * * * *